United States Patent
Tanaka et al.

(10) Patent No.: US 6,232,653 B1
(45) Date of Patent: May 15, 2001

(54) TSOP TYPE SEMICONDUCTOR DEVICE

(75) Inventors: Naotaka Tanaka; Akihiro Yaguchi; Ryuji Kohno; Kiyomi Kojima; Takeshi Terasaki, all of Ibaraki-ken; Hideo Miura, Koshigaya; Junichi Arita, Musashimurayama; Chikako Imura, Higashiyamato, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/270,500

(22) Filed: Mar. 17, 1999

(30) Foreign Application Priority Data

Mar. 17, 1998 (JP) .................................................. 10-066470

(51) Int. Cl.⁷ .......................... H01L 23/48; H01L 23/495; H01L 23/52
(52) U.S. Cl. .......................... 257/669; 257/692; 257/702; 438/123
(58) Field of Search .................................... 257/692, 666, 257/667, 671, 677, 787, 702, 686, 676, 669; 438/123

(56) References Cited

U.S. PATENT DOCUMENTS

| | | | |
|---|---|---|---|
| 5,064,706 | * 11/1991 | Ueda et al. | 257/667 |
| 5,357,139 | * 10/1994 | Yaguchi et al. | 257/666 |
| 5,446,313 | *  8/1995 | Masuda et al. | 257/666 |
| 5,530,286 | *  6/1996 | Murakami et al. | 257/692 |
| 5,554,885 | *  9/1996 | Yamasaki et al. | 257/666 |
| 5,811,875 | *  9/1998 | Jeong et al. | 257/672 |
| 5,886,405 | *  5/1999 | Kim et al. | 257/692 |
| 6,030,859 | *  2/2000 | Anjoh et al. | 257/670 |

FOREIGN PATENT DOCUMENTS 61-241959    10/1986   (JP) .

* cited by examiner

Primary Examiner—Mary Wilczewski
(74) Attorney, Agent, or Firm—Antonelli, Terry, Stout & Kraus, LLP

(57) ABSTRACT

A TSOP type semiconductor device having a LOC structure employing a copper (alloy) type frame prevents resin cracks that occur in a reliability test such as a temperature cycle test. The TSOP type semiconductor device has narrower common inner leads where a resin crack would be likely to occur first, and has a thinner chip.

23 Claims, 13 Drawing Sheets

BOTTOM SURFACE OF COMMON INNER LEAD

SIDE SURFACE OF COMMON INNER LEAD

TSOP TYPE SEMICONDUCTOR DEVICE

BACKGROUND OF THE INVENTION

The present invention relates to a semiconductor device and, more particularly, to a resin sealed package structure that is effectively adopted in such a case where a copper (alloy) type frame is used for a lead on chip (LOC) structure of an LSI circuit.

An example of the basic structure of a LOC package is shown in FIG. 16. The basic structure of the LOC package is disclosed in JP-A-61-241959. A plurality of inner leads 3, which are extended onto a surface of a chip with a circuit formed thereon, are fixed with an adhesive agent on the chip 5 through an insulating film. The inner leads 3 and the chip 5 are electrically connected by bonding wires (thin metallic wires) 4 In order to reduce the number of pins and to ensure stable supply of line voltage, a common inner lead 1 is provided in parallel to the arranging direction of the electrodes of the chip 5 and electrically connected, as a power lead that permits multi-point connection, by means of the chip 5 and the bonding wires 4. Lastly, the entire assembly is sealed with a molding resin 7. In comparison with a conventional package design wherein a chip is mounted on a die pad, the LOC design has advantages such that it permits a larger chip to be mounted, accommodates larger current to achieve higher speed, and allows higher flexibility of chip layout design.

SUMMARY OF THE INVENTION

Packages having the LOC structures usually employ alloy-42 for the lead frame constituent thereof. Using the alloy-42, which has a similar linear expansion coefficient to that of a chip, reduces the thermal mismatch in the inside of the packages, thus it is possible to design the inside of the packages in low stress during reliability tests such as a temperature cycle test. Progress has been made in the development of molding resins with lower thermal expansion, and the thermal mismatch between the alloy-42 and resins, which was a problem with conventional resin constituents, has been considerably reduced. Hence, it has become possible to provide LOC packages with high reliability.

In recent years, however, there has been an increasing trend toward larger capacities of LSI's that naturally call for larger chips, and also toward thinner packages in which the height of leads is 1.27 mm or less. This has posed the following problems. The use of frames made of alloy-42 having a large difference in coefficient of thermal linear expansion from a glass epoxy type printed circuit board has become more likely to shorten the heat cycle service life of a solder joint that electrically connects an external lead with the printed circuit board. In addition, achieving less heat resistance for the package structures has also become an important task for securing reliability in an effort to attain higher speed of LSI's and modules with higher density for larger memory capacity. There has been an increasing demand for use of copper (alloy) type frames that provide similar coefficients of thermal linear expansion to those of printed circuit boards and have good heat radiation characteristics in order to make it possible to secure reliability and to lower the heat resistance of solder joints in LOC package structures designed for DRAM's, etc. that are expected to provide larger capacities and higher speed.

When designing a package which will use a copper (alloy) type frame, there will be a significant thermal mismatch between the copper (alloy) type frame and a chip. For this reason, there has been a danger in that, during reliability tests such as a temperature cycle test, peeling may take place at the adhesive interface between the resin and an inner leads, and a common inner lead that are restrained in their thermal deformation by the chip, possibly leading to the occurrence of a package crack beginning at a peeling end of the common inner lead in particular.

FIG. 17 schematically illustrates how the package crack occurs. During a temperature cycle test or the like, the adhesive interface of a bottom surface and a side surface closer to the center of the common inner lead peel, and this is considered to lead to stress concentration on the peeling end of the common inner lead with a consequent occurrence of a crack beginning at the peeling end.

Referring now to FIGS. 18 to 21, a description will be given of a cause for the occurrence of the peeling of the bottom surface and the side surface closer to the center of the common inner lead. FIGS. 18 and 19 respectively show the results of a copper frame and an alloy-42 frame in terms of stress distribution on the adhesive interface of the top surface and the bottom surface of a common inner lead that is observed during reflow soldering. It was supposed that slight initial peeling existed at one end of the adhesive interface of the common inner lead. Heating was carried out from a molding temperature (175 degrees Celsius) to 245 degrees Celsius to make finite element analysis on thermoelasticity, and the stress distributions at the initial peeling ends at that time were calculated.

It can be seen that, the, copper (alloy) type frame having a linear expansion coefficient significantly different from that of the chip develops an extremely higher shear stress in its bottom surface, where the thermal deformation of resin is restricted by the chip, than that observed in the alloy-42.

FIGS. 20 and 21 respectively show the stress distribution in the adhesive interface of the bottom surface and the side surface closer to the center of the common inner lead at room temperature after the completion of molding. As in the case shown in FIGS. 18 and 19, it was supposed that slight initial peeling existed at one end of the adhesive interface of the common inner lead. Cooling was carried out from a molding temperature (175 degrees Celsius) to 20 degrees Celsius to make finite element analysis on thermoelasticity, and the stress distributions at the initial peeling ends at that time were calculated. Also shown in the figures are the stress distributions in the other adhesive interface in a case where either the side surface or the bottom surface of the common inner lead peels. It can be seen that the vertical stress in the side surface of the common inner lead is three times as high as the shear stress in the bottom surface thereof. Further, if either the side surface or the bottom surface peels, the stress generated in the other interface is doubled. This means that, if either the side surface or the bottom surface peels, the possibility of peeling of the other interface will be even higher.

Accordingly, it is an object of the present invention to provide a LOC package structure capable of solving the problems discussed above when employing a copper (alloy) type frame as the lead frame constituent of a LOC package. To this end, the present invention primarily provides a configuration of a common inner lead, a thickness of resin on a chip, and a chip thickness that are effective for inhibiting the peeling of an interface of a common inner lead or for inhibiting a crack occurring at a peeling end of the common inner lead.

FIG. 22 shows an example related to a TSOP of a LOC structure employing a copper (alloy) type frame, wherein it was assumed that the bottom surface and the side surface close to the center of a common inner lead that are parallel to the arranging direction of the electrodes on a chip of the common inner lead have peeled. The common inner lead was subjected to a temperature cycle of cooling from 150 degrees Celsius to −55 degrees Celsius, and the stress intensity factors of the peeling ends of the common inner lead were calculated with respect to the thickness of resin on a chip. The conventional dimensions of the portions of the common inner lead that are parallel to the arranging direction of the electrodes on the chip complied with the specifications of the common inner lead of a TSOP having a conventional LOC structure shown in FIG. 24; the width was set to a minimum value, 0.3 mm, necessary for coating provided for inhibiting short-circuiting between bonding wires and the common inner lead; and the thickness was set to 0.125 mm, which is a standard thickness of a lead frame used for a TSOP.

The crack occurrence limit in the temperature cycle test is defined by a stress intensity factor range ($K \leq 1.3$) at a resin crack propagation rate of 0.01 m/cycle (150 through −55 degrees Celsius) or less, which has been experimentally obtained. The stress intensity factor range at the crack propagation rate has been defined as the crack occurrence limit because adopting this limit suppresses a crack length to approximately ten-odd $\mu$ms after 1000 cycles under the above temperature condition, thus controlling the crack length so that it does not lead to a visible crack or disconnection of a wire. In the graph, calculation results are given in contrast with the calculated results obtained with the conventional dimensions. The calculation results are obtained in different three cases, namely, a case wherein the width of the portion parallel to the arranging direction of the electrodes on a chip of the common inner lead has been reduced to a half, 0.15 mm, a case wherein the thickness thereof has been reduced to a half, 0.0625 mm, by half-etching the top and bottom surfaces thereof, and a case wherein both width and thickness have been reduced to a half.

There are also shown calculation results obtained in a case wherein only the side surface peeled, the peeling of the bottom surface being prevented by some means. The calculation results shown in FIG. 22 suggest that the following measures 1 to 4 are effective for reducing the stress intensity factor of the upper end of the common inner lead:

1. Increase the thickness of the resin on a chip.
2. Decrease the width of a common inner lead.
3. Decrease the thickness of the common inner lead.
4. Prevent the peeling of the bottom surface of the common inner lead (only the side surface peels).

Implementing measure 1 above, however, is likely to cause a chip crack or warp since it would inevitably make the resin under the chip thinner and cause unbalance between the resin on the chip and the resin thereunder at the time of molding. For instance, in the case of a TSOP (total thickness: 1 mm; chip thickness: 0.28 mm) that employs a copper (alloy) frame, if the tolerance of warp is set to 0.05 mm or less, then it is necessary to adjust the design value of the thickness of the resin on a chip to 0.37 mm or less. The copper (alloy) type frame thermally contracts to an extent equal to or more than resin; therefore, the resin under the chip must be made thicker than that in the case where the alloy-42 is used in order to prevent the unbalance in the thermal contraction between the resin on the chip and the resin thereunder. Hence, when a copper (alloy) type frame is used, measure 1 has limitation. It can be said that combining measures 2 and 3 are more effective.

FIG. 23 shows an example that defines the relationship between the thickness and the width of a common inner lead that enables the prevention of a package crack when subjected to a temperature cycle, the defined relationship being based on the analysis results shown in FIG. 22. The thickness of the common inner lead in this example may be the thickness of the entire frame or the thickness of the portion of the common inner lead parallel to the arranging direction of the electrodes on the chip. The latter case corresponds to a case wherein the top surface of the common inner lead is half-etched. This is a case wherein the thickness of resin on the chip is set to 0.35 mm, assuming a worst case, and considerations are given to the variations of ±20 $\mu$m in resin thickness after molding when the design value of the thickness of the resin on the chip is set to 0.37 mm.

The calculation is made based on the analysis results obtained under the respective conditions with the same thickness of the resin on the chip shown in FIG. 22. Relational expressions of the thickness, the width, and the stress intensity factor range (K) are created for a case wherein the width is changed with a constant thickness (fixed at 0.125 mm or 0.0625 mm) and a case wherein the thickness is changed with a constant width (fixed as 0.3 mm or 0.15 mm). Then, widths W for each thickness that provide a limit value (K=1.3) of the stress intensity factor range defined in FIG. 22 are calculated, and thicknesses t for each width are calculated.

The calculation results are plotted with dots in the graph of FIG. 23. A straight line obtained by linearly approximating the plotting dots is provided as a limitation straight line ($W = -1.95t + 0.44$) that enables the prevention of a package crack. Widths of the limitation straight line ($W \leq -1.95t + 0.44$) or less are established as the design values for the respective frame thickness.

Hence, it can be understood that, since the design frame thickness herein is 0.125 mm, package cracks can be prevented by setting the width of the portion of the common inner lead that is parallel to the arranging direction of the electrodes on the chip to approximately 0.2 mm or less. The same method can be applied for effecting definition based on the analysis results of FIG. 22, and a design standard for an arbitrary thickness of a resin on a chip can be provided for the configuration of a common inner lead to prevent package cracks.

FIG. 26 shows the results of implementing the foregoing measure 4; it indicates the shear stress distribution in the bottom surface of a common inner lead which is observed when the thickness of the bottom surface of the portion of the common inner lead that is parallel to the arranging direction of the electrodes on the chip has been reduced to a half. As shown in the figure, reducing the thickness of the bottom surface to a half has increased the distance between the common inner lead and the chip with a resultant reduction of approximately 40% in the shear stress of the interface. This indicates that the measure is effective as a preventive measure against the peeling of the bottom surface of the common inner lead.

Based on the study results described above, the present invention provides a LOC package structure that employs a highly reliable copper (alloy) type frame

DESCRIPTION OF THE PREFERRED EMBODIMENTS

Embodiments of the present invention will be described with reference to the accompanying drawings.

Figure 1:
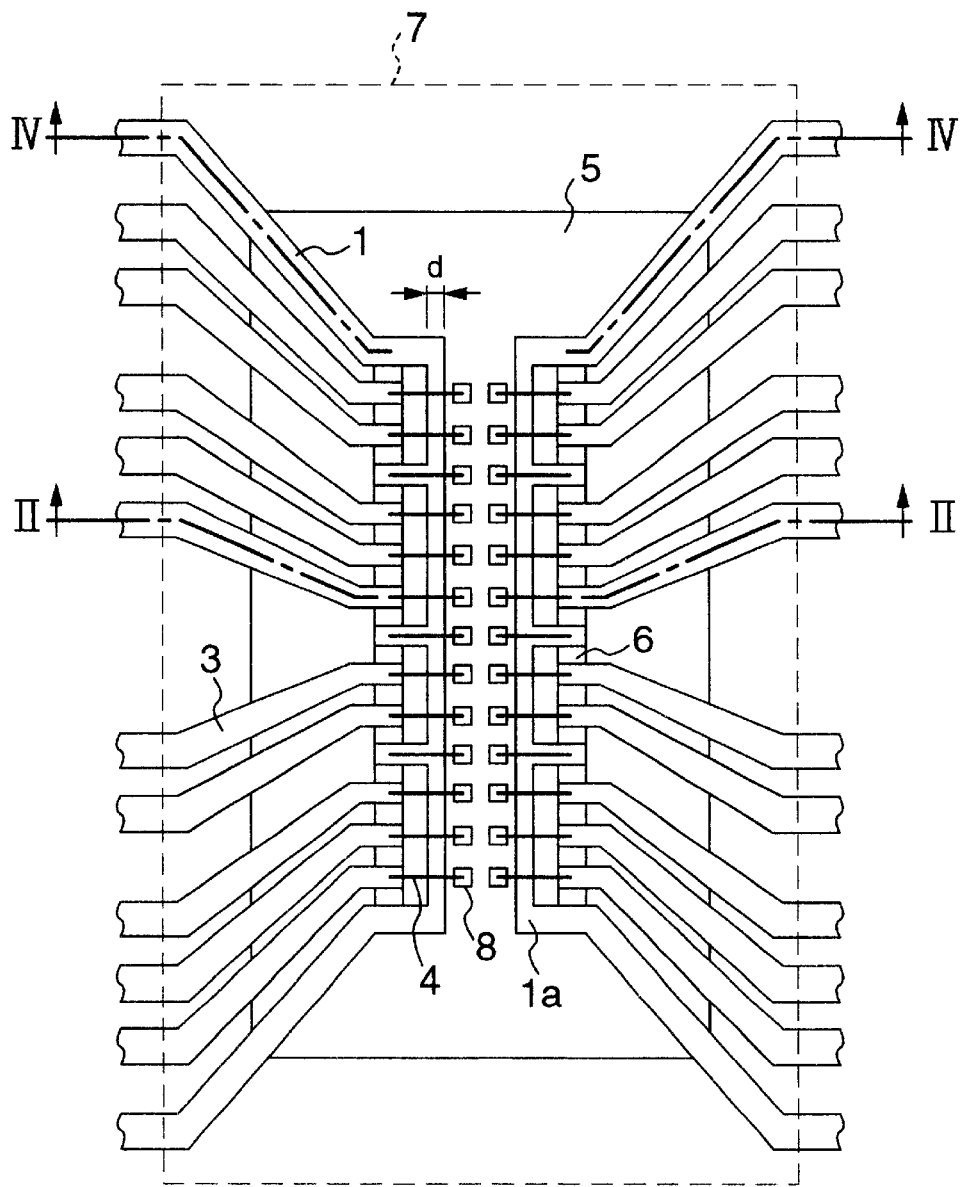
FIG. 1 is a top plan view of a semiconductor device according to a first embodiment of the present invention.
Figure 2:
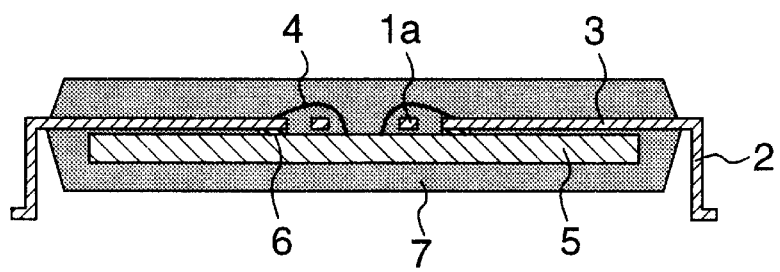
FIG. 2 is a sectional view of a semiconductor device according to a first embodiment of the present invention, taken along line II—II in FIG. 1.

FIGS. 1 and 2 are a top plan view and a sectional view of a semiconductor device indicative of a first embodiment in accordance with the present invention. A lead frame composed of a copper (alloy) type constituent has outer leads 2 and inner leads 3, and bonding portions of the inner leads 3 are provided with Ag plating or Sn plating. A semiconductor chip 5 is abutted against the bottom surfaces of the inner leads 3, and the inner leads 3 and the semiconductor chip 5 are bonded via an insulating film 6. The insulating film 6, which provides electrical insulation between a plurality of the inner leads 3 and the semiconductor chip 5, comprises an insulating tape substrate having both surfaces thereof provided with a homogeneous polyimide-based resin. The thickness of the insulating film 6 ranges from about 50 $\mu$m to about 100 $\mu$m. The position where the insulating film 6 is attached is not limited to the bonding area of the inner leads 3 shown in the embodiment.

The inner leads having portions disposed parallel to the arranging directions of the electrodes arranged in rows on a semiconductor element are common inner leads 1 for supplying line voltage to the semiconductor element. The inner leads 1 are capable of reducing the number of power pins and supplying stable line voltage to a semiconductor chip. The bonding portions of the inner leads 3 and the common inner leads 1 and electrode pads 8 formed on the semiconductor chip are electrically connected with thin metallic wires 4 such as gold wires or the like, and the entire assembly is sealed by an epoxy type molding resin 7. Preferably, the molding resin 7 has a coefficient of thermal linear expansion of $10 \times 10^{-6}/°$ C. or less at a glass-transition temperature or below because, if an interface of the common inner lead peels during a temperature cycle test or other reliability testing, the stress in the resin at the peeled end of the common inner lead increases as the coefficient of thermal linear expansion increases.

Width (d) of portions 1a disposed parallel to the arranging direction of the electrodes arranged in rows on the chip is set to 0.2 mm or less according to the study results discussed above. Regarding the design value of the width, however, the limit value intended for preventing a package crack varies, depending on the thickness of the frame used and the thickness of the resin on a chip. Hence, if the specifications are different from those in the present invention (frame thickness: 0.125 mm; minimum thickness of resin on a chip: 0.35 mm), the design value of the width may be changed as necessary according to the technique described above.

Referring to section along line II—II in FIG. 1 across the inner lead 3, a TSOP employing a copper frame is fabricated with a design value of 0.37 mm or less for the thickness of the resin on the chip, or 0.39 mm or less for the finished dimension, considering the variations in molding thickness so as to prevent the molded package from warping. The same applies to the embodiments to be discussed hereinafter.

Figure 3:
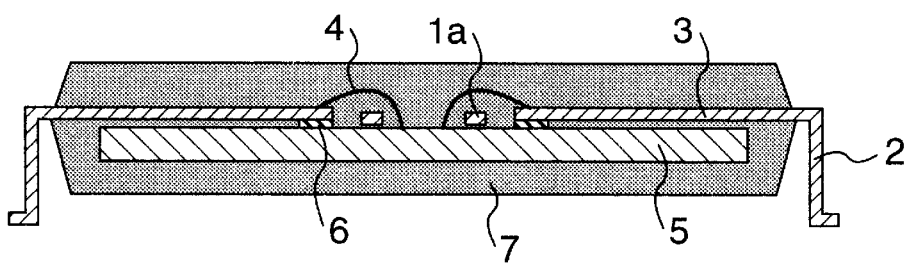
FIG. 3 is a sectional view of a semiconductor device according to a second embodiment of the present invention, similar to FIG. 2.
Figure 4:
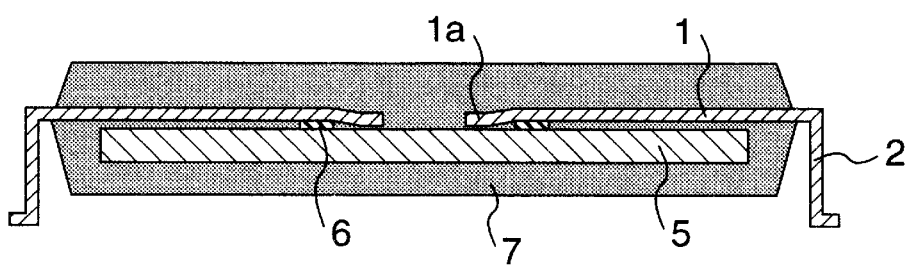
FIG. 4 is a sectional view of the semiconductor device according to the second embodiment of the present invention, taken along a line similar to the line IV—IV in FIG. 1.

FIGS. 3 and 4 are respectively sectional views of a semiconductor device of a second embodiment in accordance with the present invention, and show a section across the inner lead 3 similar to FIG. 2 and a section across the common inner lead 1, taken along a line similar to the line IV—IV in FIG. 1. The requirements on a wire height are stricter because the resin on the chip must be made thinner than that in the case where the alloy-42 is used in order to prevent the warp. Further, in the first embodiment, the width of the portions 1a of the common inner leads 1 parallel to the arranging direction of the electrodes on the semiconductor chip is smaller than that in a conventional one. Hence, it may be difficult to effect the conventional coating with an insulating constituent. Therefore, the portions 1a of the common inner leads 1 in the lead frame of the first embodiment parallel to the arranging direction of the electrodes on the chip are offset downward about 0.05 mm to an extent that does not cause them to touch the chip 5 so as to secure a clearance for the bonding wires and to obviate the need of providing the top surfaces of the common inner leads with coating by an insulating constituent. As a synergistic effect, the resin on the portions 1a of the common inner leads 1 parallel to the arranging direction of the electrodes on the chip becomes thicker owing to the downward offset, permitting further improved reliability in the prevention of the cracks in the resin.

Figure 5:
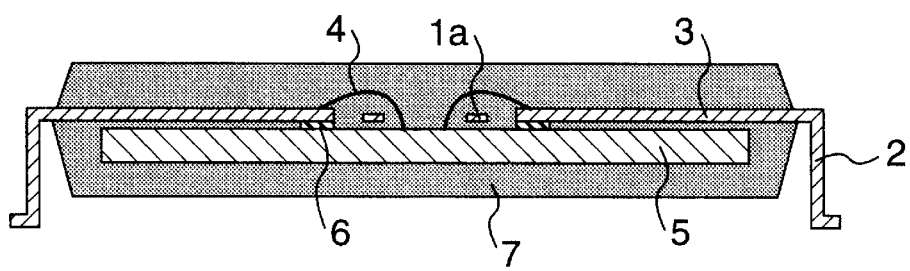
FIG. 5 is a sectional view of a semiconductor device according to a third embodiment of the present invention, similar to FIG. 2.
Figure 6:
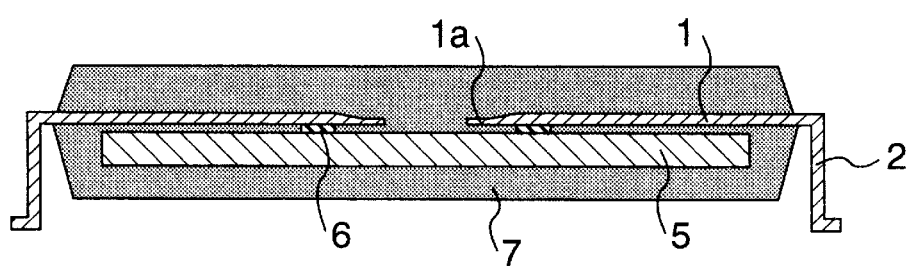
FIG. 6 is a sectional view of the semiconductor device according to the third embodiment of the present invention, similar to FIG. 4.

FIGS. 5 and 6 are sectional views of a semiconductor device in a third embodiment in accordance with the present invention, and show a section across the inner lead 3, similar to FIG. 2 and a section across the common inner lead 1, similar to FIG. 4. The top surfaces of the portions 1a of the common inner leads 1 that are parallel to the arranging direction of the electrodes on the chip are half-etched to set the thickness to 0.07 mm or less. However, as in the case of the first embodiment, the limit value of the thickness depends on the relationship with the width of the portions 1a of the common inner leads 1 that are parallel to the arranging direction of the electrodes on the chip. For this reason, this embodiment provides a configuration for a width (0.3 mm) of the conventional design.

Figure 7:
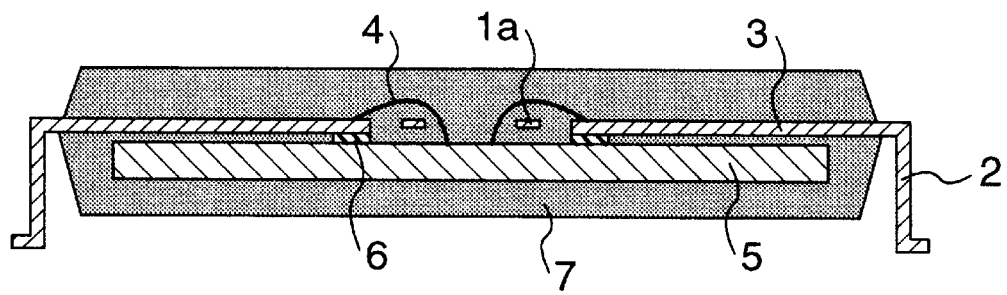
FIG. 7 is a sectional view of a semiconductor device according to a fourth embodiment of the present invention, similar to FIG. 2.
Figure 8:
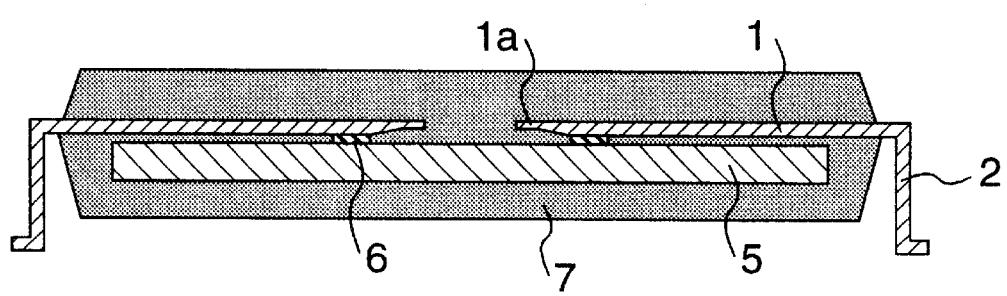
FIG. 8 is a sectional view of the semiconductor device according to the fourth embodiment of the present invention, similar to FIG. 4.
Figure 26:
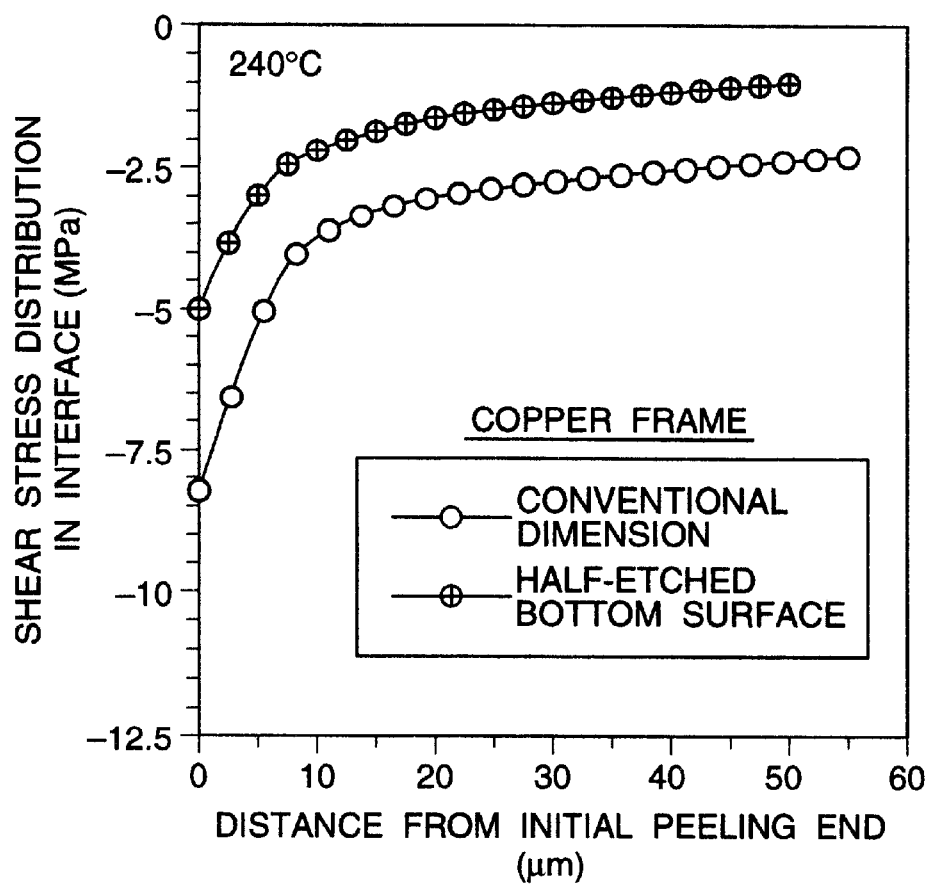
FIG. 26 is a graph showing the stress reducing effect achieved by half-etching the bottom surface of a common inner lead.

FIGS. 7 and 8 are sectional views of a semiconductor device in a fourth embodiment in accordance with the present invention, and show a section across the inner lead 3 and a section across the common inner lead 1. The bottom surfaces of the portions 1a of the common inner leads 1 that are parallel to the arranging direction of the electrodes on the chip are half-etched to make them partially thinner. This is effective for preventing the peeling of the bottom surfaces of the common inner leads since the shear stress in the bottom surfaces of the common inner leads is considerably reduced by making the bottom surfaces thinner as shown in FIG. 26. Combining the fourth embodiment with the first embodiment makes it possible to expect even higher reliability.

Figure 9:
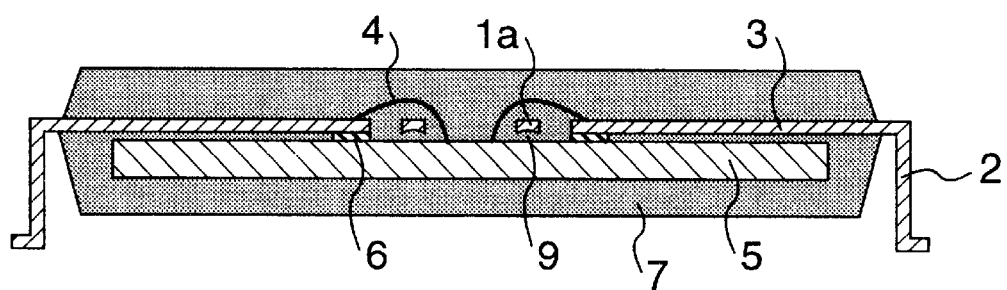
FIG. 9 is a sectional view of a semiconductor device according to a fifth embodiment of the present invention, similar to FIG. 2.

FIG. 9 is a sectional view of a semiconductor device in a fifth embodiment of the present invention. The bottom surfaces of the portions 1a of the common inner leads 1 that are parallel to the arranging direction of the electrodes on the chip are provided with grooves 9, which have for example, a round or elliptic section, by half etching. The grooves 9 formed by half etching area and filled with resin dramatically reduce the stress in the adhesive interface of the bottom surfaces of the common inner leads. The fifth embodiment is as effective as the fourth embodiment for preventing the peeling of the bottom surfaces of the common inner leads.

Figure 10:
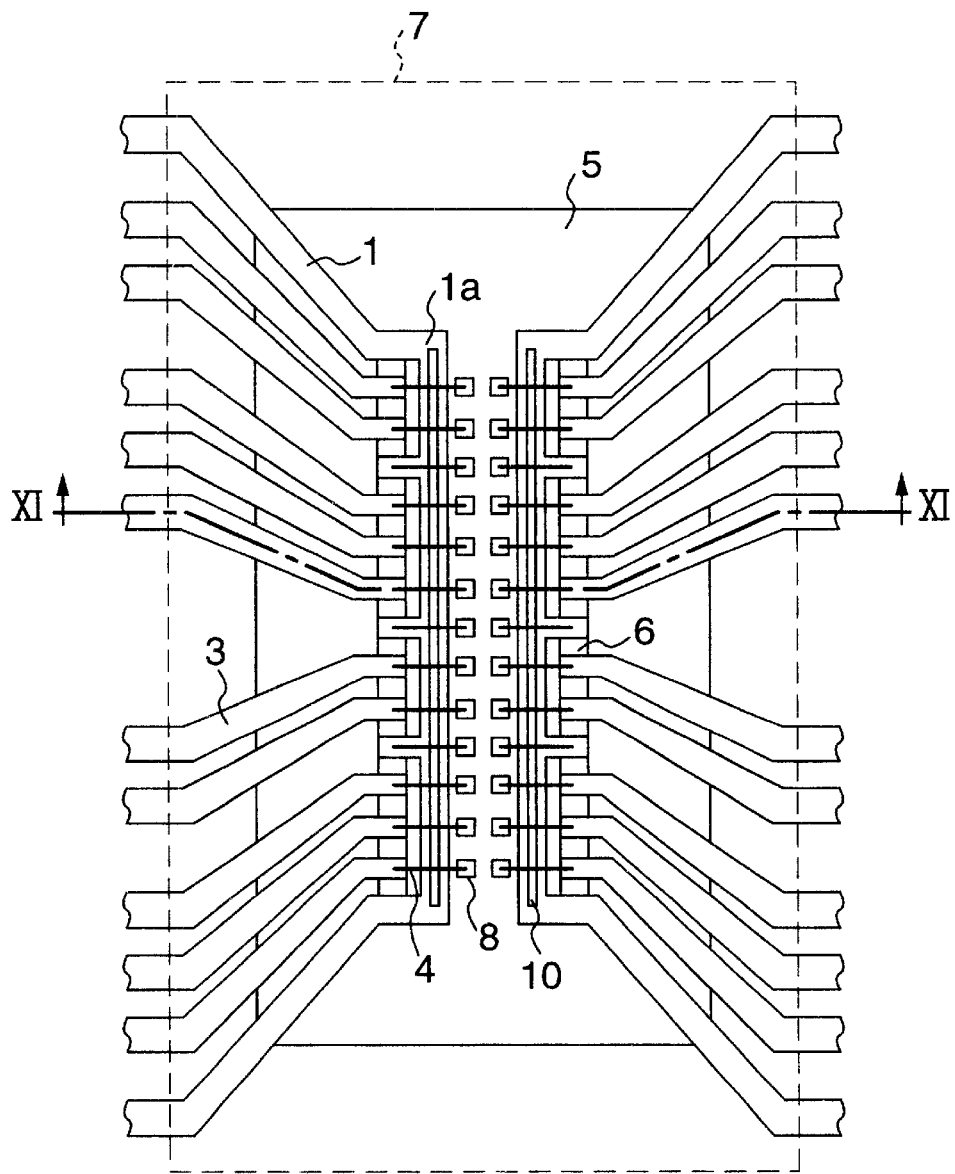
FIG. 10 is a top plan view of a semiconductor device according to a sixth embodiment of the present invention.
Figure 11:
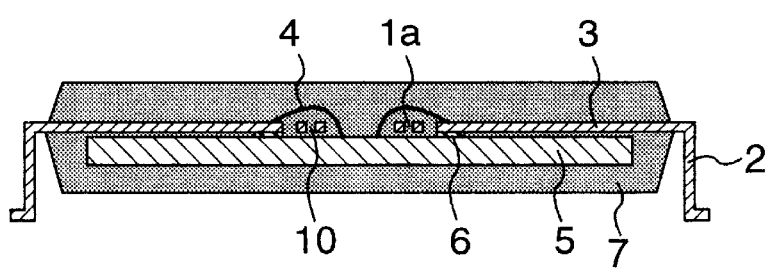
FIG. 11 is a sectional view of the semiconductor device according to the sixth embodiment of the present invention, taken along line XI—XI in FIG. 10.

FIGS. 10 and 11 are a top plan view and a sectional view, similar to FIG. 2, of a semiconductor device in a sixth embodiment in accordance with the present invention. The portions 1a of the common inner leads 1 that are parallel to the arranging direction of the electrodes on the chip are provided with through slits. Providing the through slits makes it possible to substantially decrease the width of the common inner leads, so that the sixth embodiment is also expected to provide the same advantage as that obtained by the first embodiment.

Figure 12:
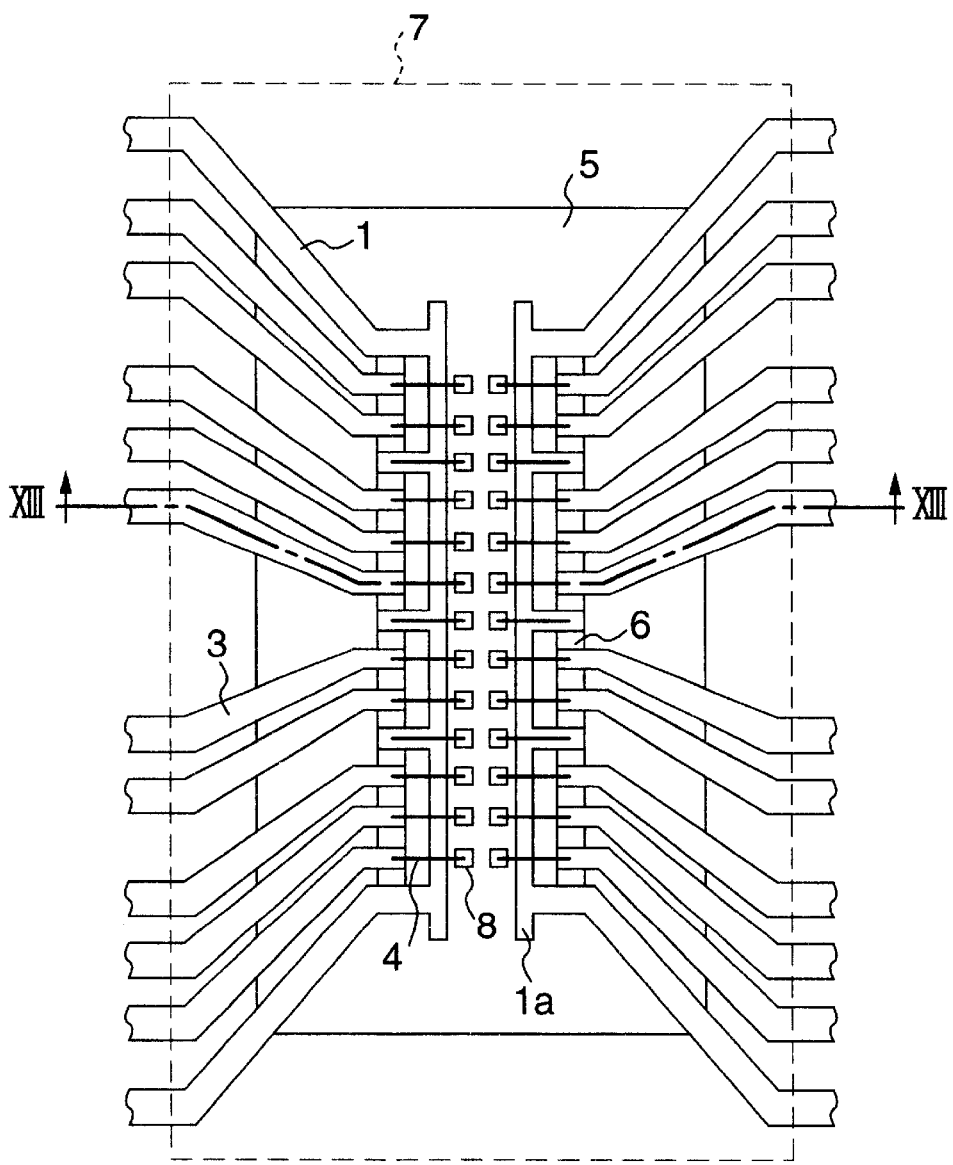
FIG. 12 is a top plan view of a semiconductor device according to a seventh embodiment of the present invention.
Figure 13:
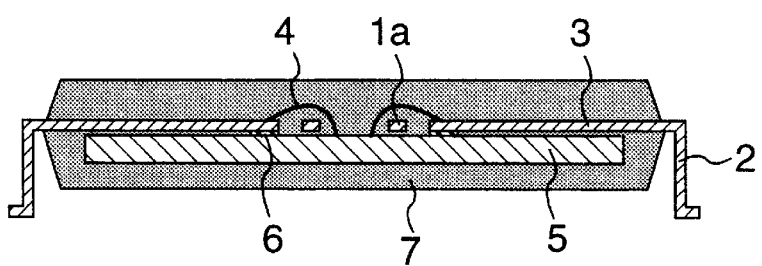
FIG. 13 is a sectional view of the semiconductor device according to the seventh embodiment of the present invention, taken along line XIII—XIII in FIG. 12.

FIGS. 12 and 13 are a top plan view and a sectional view, similar to FIG. 2, of a semiconductor device in a seventh embodiment in accordance with the present invention. The portions 1a formed in parallel to the arranging direction of the electrodes are further extended to form the L-shaped corners on the two ends of the portions 1a of the common inner leads 1 in the first embodiment, which are parallel to the arranging direction of the electrodes on the chip, into T shapes. This alleviates stress concentration at the L-shaped corners subjected to the severest condition stress-wise.

Figure 14:
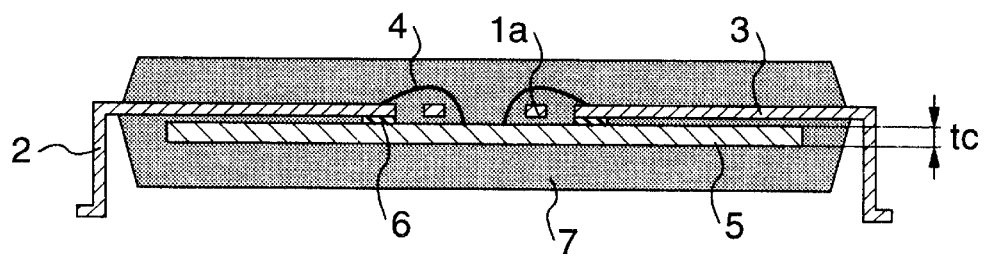
FIG. 14 is a sectional view of a semiconductor device according to an eighth embodiment of the present invention, similar to FIG. 2.

FIG. 14 is a sectional view of a semiconductor device in an eighth embodiment in accordance with the present invention. In the semiconductor device in the first embodiment, the thickness (tc) of the semiconductor chip is set to a value between 0.2 mm and 0.25 mm. Making the chip thinner enables the resin on the chip to be thicker for the same amount of warp that takes place; on the other hand, however, making the chip excessively thin may cause warp in the form of a wafer or a chip crack after molding. For this reason, the chip must have a thickness of at least 0.2 mm. This chip thickness may be applied also to the second through the seventh embodiments.

Figure 15:
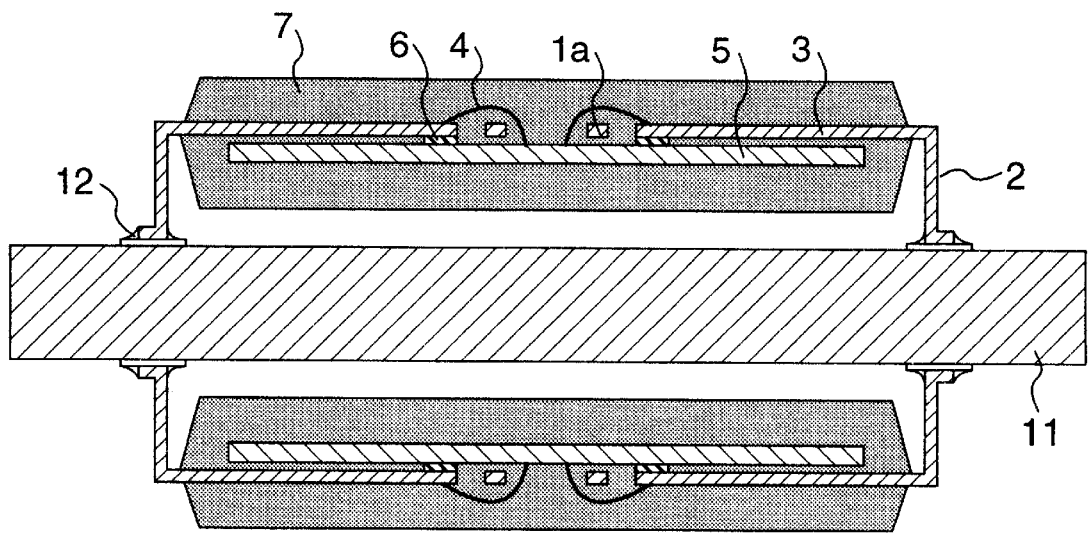
FIG. 15 is a sectional view of a semiconductor device according to a ninth embodiment of the present invention, similar to FIG. 2.
Figure 16:
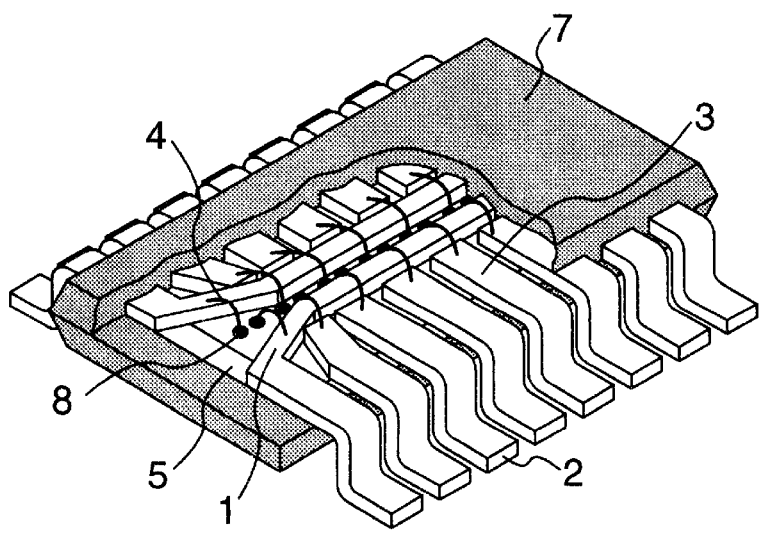
FIG. 16 is a perspective view of a prior art LOC package structure.
Figure 17:
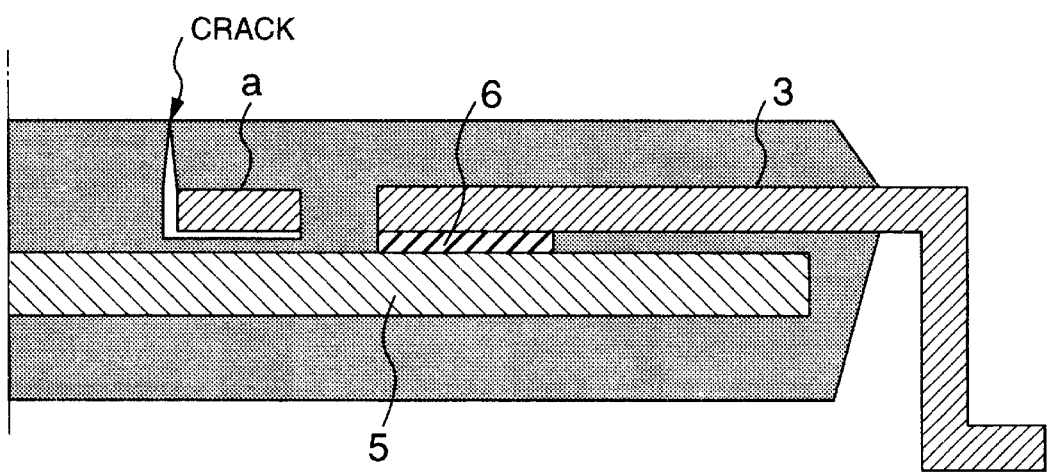
FIG. 17 is a sectional view of a prior art semiconductor device that illustrates how a package crack occurs.
Figure 18:
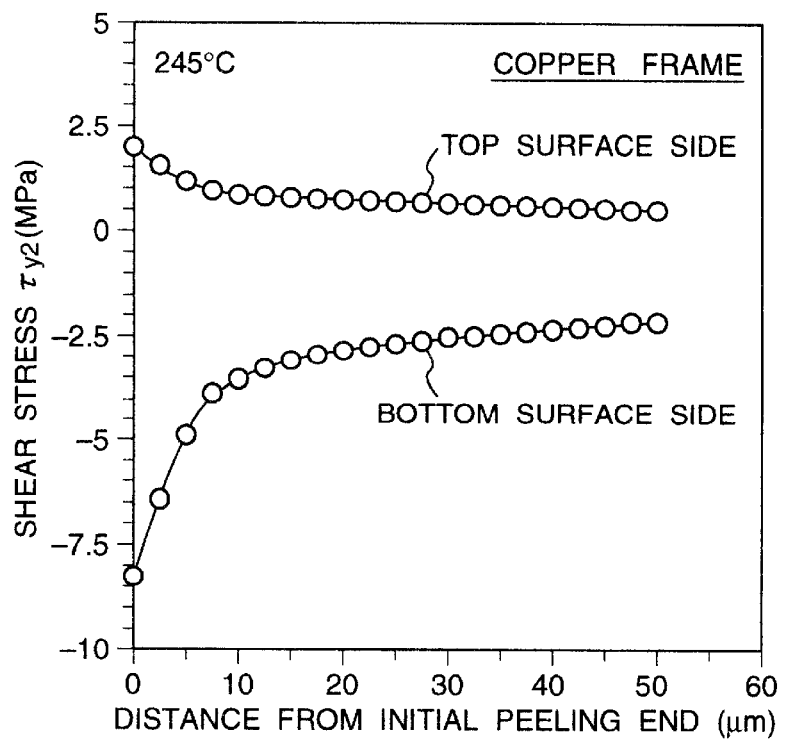
FIGS. 18 and 19 are graphs showing shear stress distribution in an adhesive interface of the bottom surface of a common inner lead subjected to reflow soldering.
Figure 19:
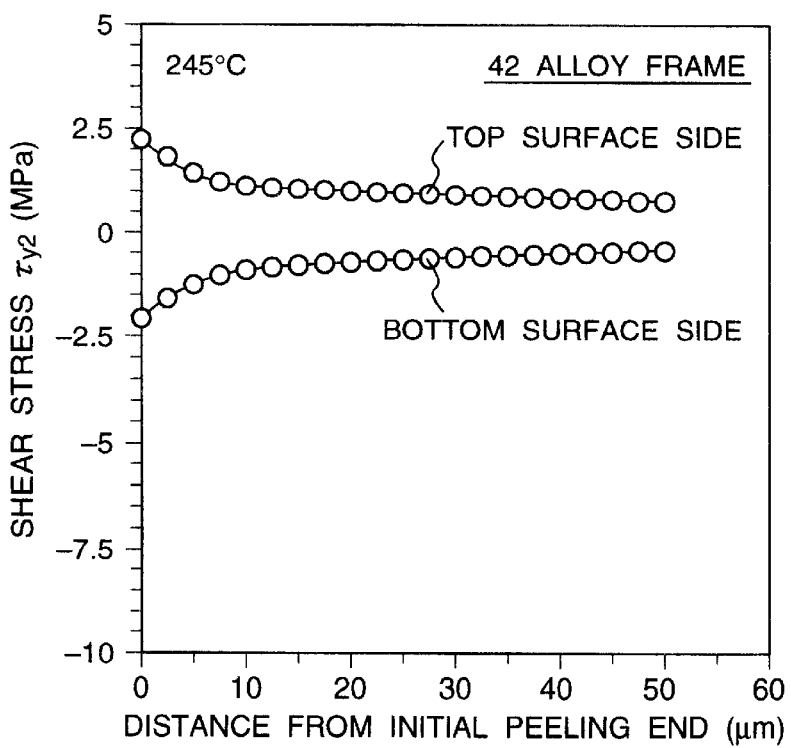
Figure 20:
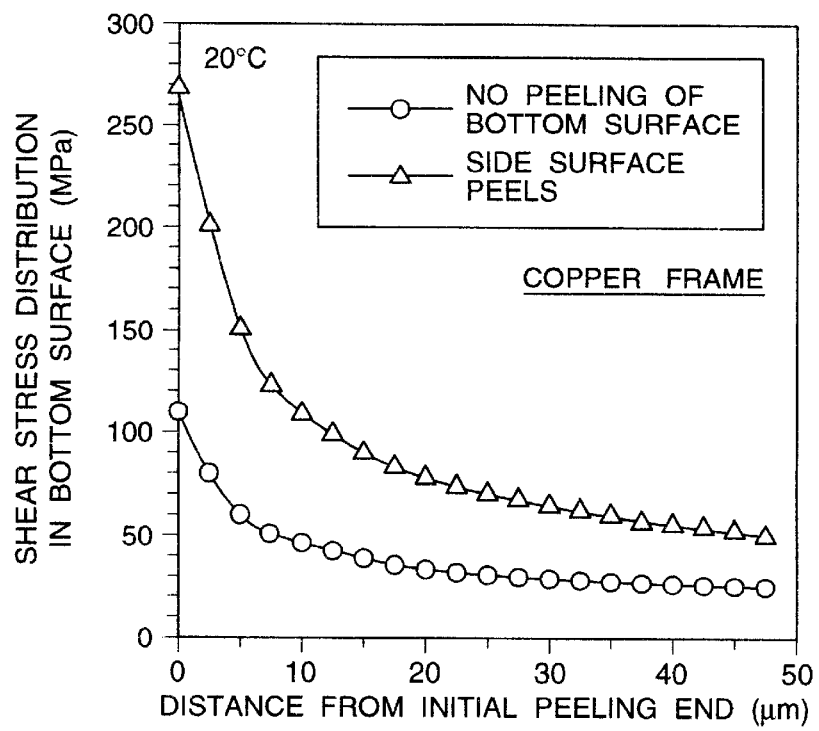
FIGS. 20 and 21 are graphs showing stress distribution in the adhesive interfaces of the bottom surface and a side surface closer to the center of the common inner lead after molding.
Figure 21:
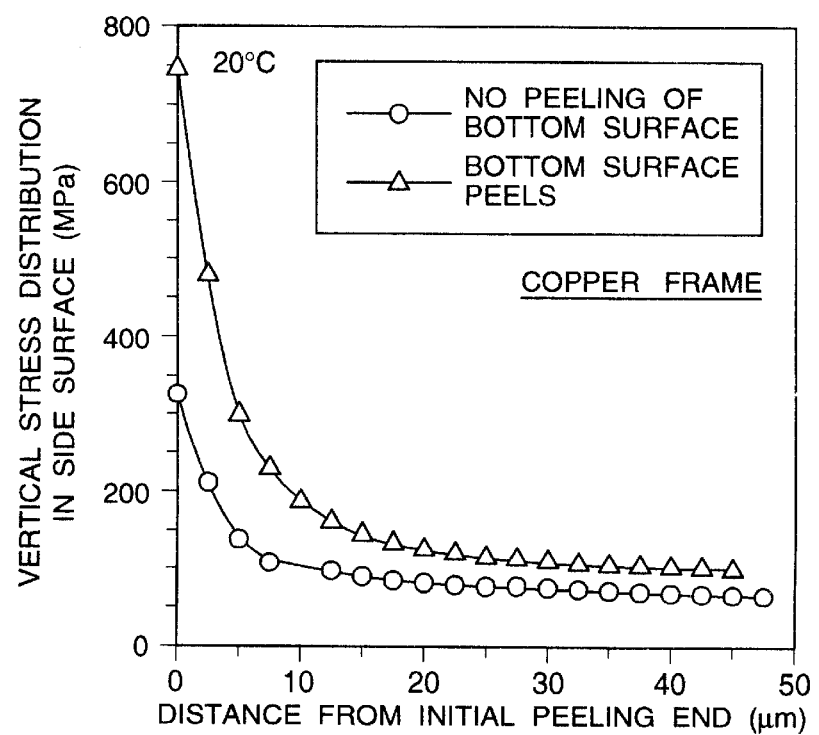
Figure 22:
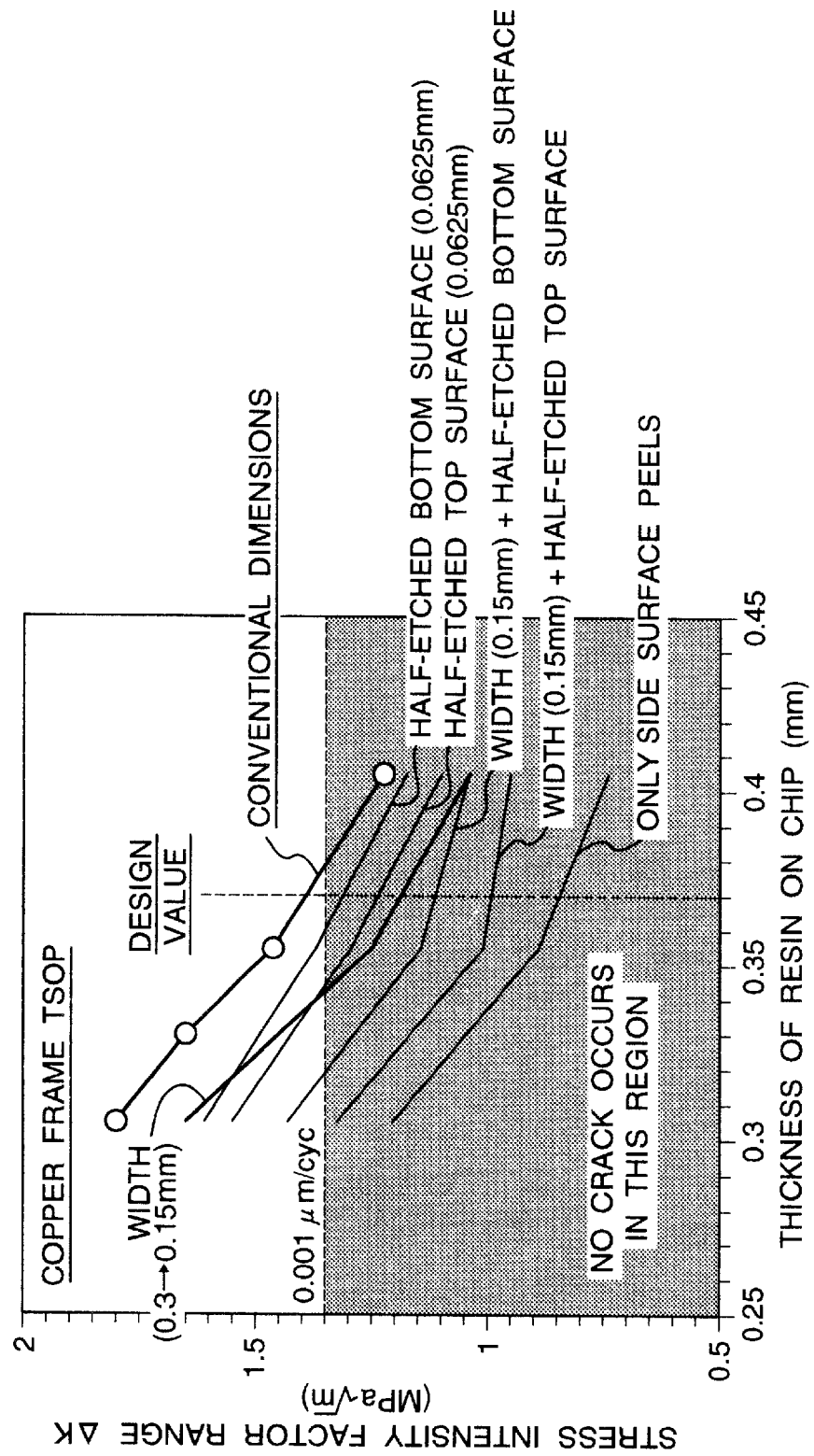
FIG. 22 is a graph showing a stress intensity factor range of resin at a peeled end of the common inner lead.
Figure 23:
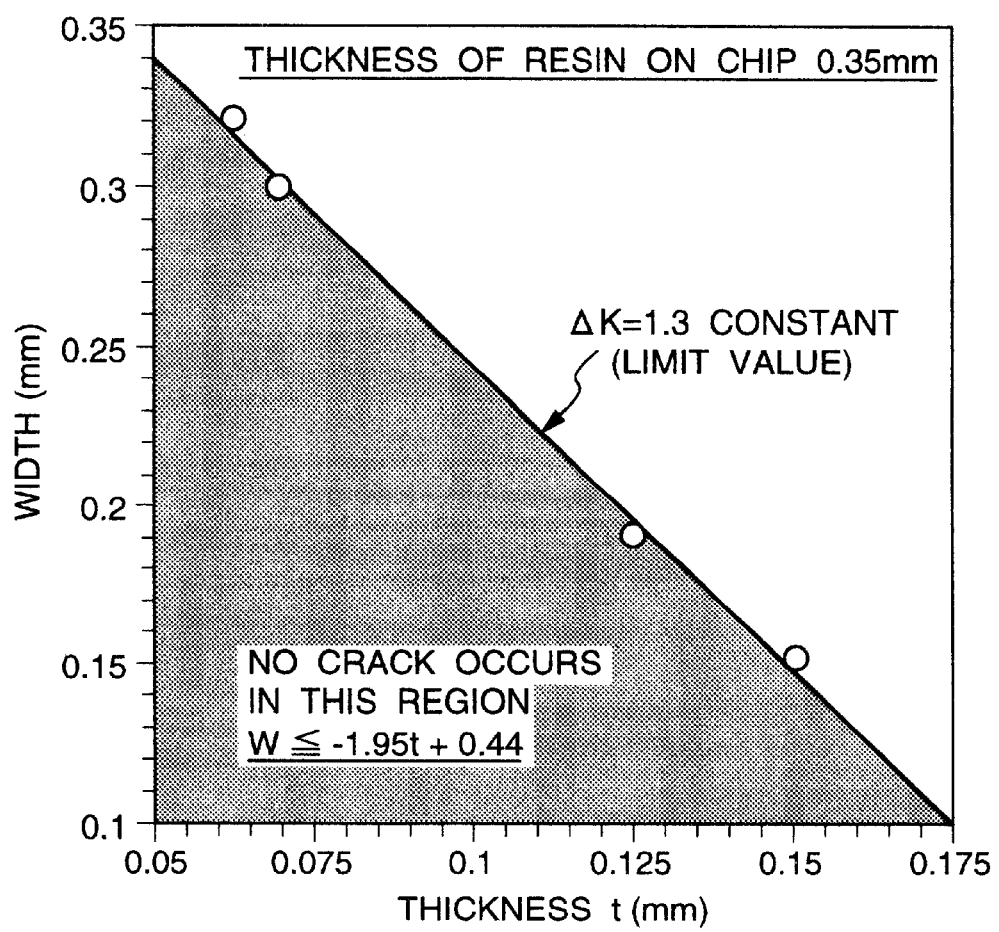
FIG. 23 is a graph showing a relationship between the thickness and width of the common inner lead that prevent resin from cracking during a temperature cycle.
Figure 24:
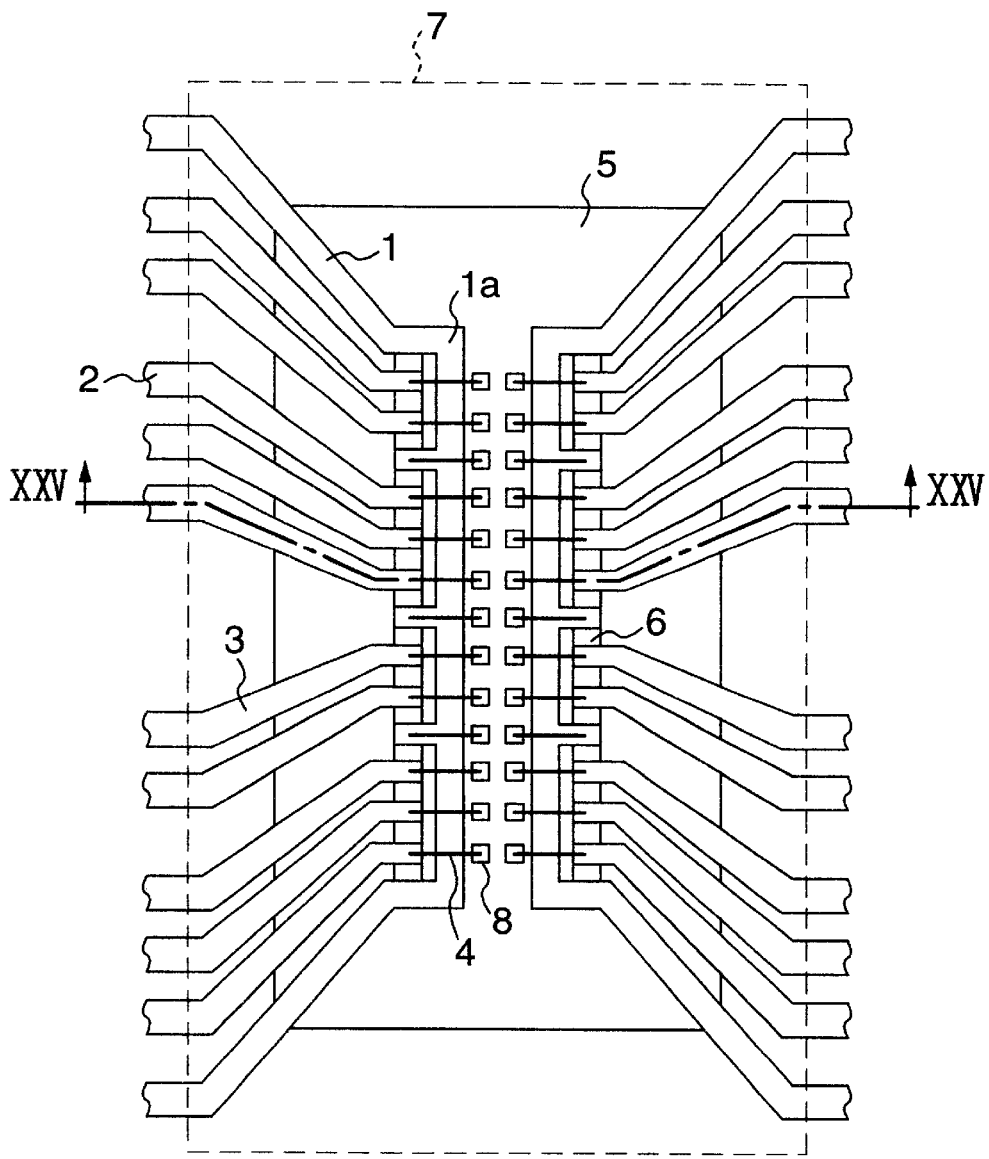
FIG. 24 is a top plan view of a lead frame of a conventional LOC package.
Figure 25:
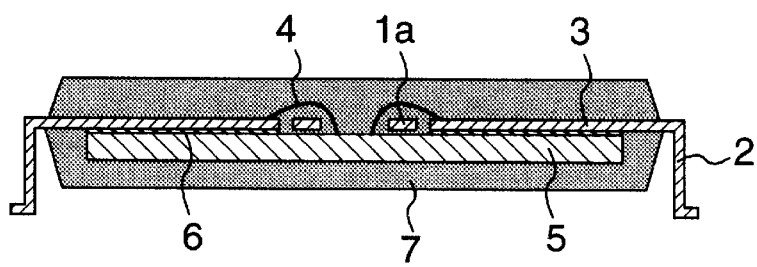
FIG. 25 is a sectional view taken along line XXV—XXV in FIG. 24.

FIG. 15 is a sectional view of a semiconductor device showing a ninth embodiment. The semiconductor device in the first embodiment is mounted, via solder 12, on pads formed on the printed circuit board 11. A glass epoxy type printed circuit board is mainly used for the printed circuit board 11. For the solder, Sn-37Pb solder constituent or Sn-Ag type solder constituent free of Pb is used. In terms of the mounting form, the package is employed primarily as a double-sided mount module as shown by this embodiment. The module printed circuit board 11 is provided with a few solid wiring layers in order to enhance heat radiation from the copper outer leads 2 of the semiconductor device to the module printed circuit board 11 and further to a mother board in which the module printed circuit board 11 is inserted.

Thus, the present invention has been described in detail by means of the embodiments; however, the present invention is not limited to the above embodiments, and various changes and modifications can be made within the spirit and scope of the present invention.

According to the present invention, in a TSOP type semiconductor device having the LOC structure employing a copper (alloy) type frame, the stress in the resin portion caused by a temperature cycle test can be reduced. Hence, resin cracks and the consequent disconnection of wires or chip cracks can be inhibited, thus permitting improved reliability of a semiconductor device.

What is claimed is:

1. A semiconductor device comprising:
   a column of electrodes formed on said main surface of said semiconductor element;
   a first lead having a region extending in one direction on the main surface of the semiconductor element, said region having a length greater than a length of the column of electrodes;
   a plurality of second leads disposed in directions crossing the region;
   an insulating film provided between the first and second leads and the semiconductor element; and resin for sealing the main surface of the semiconductor element;
   wherein the first lead is formed of a copper-based constituent, and the first lead has a portion of a smaller lead width, the portion of the smaller lead width extending through the entire length of said region.

2. A semiconductor device according to claim 1, wherein the column of electrodes extends in said first direction such that said region of said first lead and said column of electrodes are substantially parallel to one another.

3. A semiconductor device according to claim 2, wherein a maximum width of the first lead in said portion having a smaller lead width is 0.2 mm or less.

4. A semiconductor device according to claim 1, wherein a maximum width of the first lead in said portion having a smaller lead width is 0.2 mm or less.

5. A semiconductor device according to claim 1, wherein the first lead is a common power supply lead.

6. A semiconductor device comprising:

a semiconductor element having a main surface;

a column of electrodes formed on said main surface of said semiconductor element;

a first lead having a region extending in one direction on the main surface of the semiconductor element, said region having a length greater than a length of the column of electrodes;

a plurality of second leads disposed in directions crossing the region;

an insulating film provided between the first and second leads and the semiconductor element; and resin for sealing the main surface of the semiconductor element;

wherein the first lead is formed of a copper-based constituent, and the first lead has a portion of a smaller lead thickness, the portion of the smaller lead thickness extending through the entire length of said region.

7. A semiconductor device according to claim 6, wherein the column of electrodes extends in said first direction such that said region of said first lead and said column of electrodes are substantially parallel to one another.

8. A semiconductor device according to claim 7, wherein a maximum thickness of the first lead in said portion having a smaller lead thickness is 0.07 mm or less.

9. A semiconductor device according to claim 6, wherein a maximum thickness of the first lead in said portion having a smaller lead thickness is 0.07 mm or less.

10. A semiconductor device according to claim 6, wherein the first lead is a common power supply lead.

11. A semiconductor device comprising:

a semiconductor element having a main surface;

a column of electrodes formed on said main surface of said semiconductor element;

a first lead having a region extending in one direction on the main surface of the semiconductor element, said region having a length greater than a length of the column of electrodes;

a plurality of second leads disposed in directions crossing the region;

an insulating film provided between the first and second leads and the semiconductor element; and resin for sealing the main surface of the semiconductor element;

wherein the first lead is formed of a copper-based constituent, and a surface of the region of the first lead is provided with a groove extending through the entire length of said region, the surface of the first lead being associated with the semiconductor element.

12. A semiconductor device according to claim 11, wherein the column of electrodes extends in said first direction such that said region of said first lead and said column of electrodes are substantially parallel to one another.

13. A semiconductor device according to claim 11, wherein the first lead is a common power supply lead.

14. A semiconductor device comprising:

a semiconductor element having a main surface;

a column of electrodes formed on said main surface of said semiconductor element;

a first lead having a region extending in one direction on the main surface of the semiconductor element, said region having a length greater than a length of the column of electrodes;

a plurality of second leads disposed in directions crossing the region;

an insulating film provided between the first and second leads and the semiconductor element; and wherein the first lead is formed of a copper-based constituent, and the region of the first lead is provided with a slit extending through the entire length of said region.

15. A semiconductor device according to claim 14, wherein the column of electrodes extends in said first direction such that said region of said first lead and said column of electrodes are substantially parallel to one another.

16. A semiconductor device according to claim 14, wherein the first lead is a common power supply lead.

17. A semiconductor device comprising:

a semiconductor element having a main surface;

a column of electrodes formed on said main surface of said semiconductor element;

a first lead having a region extending in one direction on the main surface of the semiconductor element, said region having a length greater than a length of the column of electrodes;

a plurality of second leads disposed in directions crossing the region;

an insulating film provided between the first and second leads and the semiconductor element; and resin for sealing the main surface of the semiconductor element;

wherein the first lead is formed of a copper-based constituent, and the first lead other than the region is taken out from a point located at a portion of the region closer to a center of the semiconductor element than an end of the region of the first lead.

18. A semiconductor device according to claim 17, wherein said first lead has a portion of a smaller lead width, the portion of the smaller lead width extending through the entire length of said region.

19. A semiconductor device according to claim 18, wherein the column of electrodes extends in said first direction such that said region of said first lead and said column of electrodes are substantially parallel to one another.

20. A semiconductor device according to claim 17, wherein the first lead is a common power supply lead.

21. A semiconductor device comprising:

a semiconductor element having a main surface;

a column of electrodes formed on said main surface of said semiconductor element;

a first lead having a region extending in one direction in the main surface of the semiconductor element, said region having a length greater than a length of the column of electrodes;

a plurality of second leads disposed in directions crossing the region;

an insulating film provided between the first and second leads and the semiconductor element; and resin for sealing the main surface of the semiconductor element;

wherein the first lead is formed of a copper-based constituent;

a design value of the thickness of the sealing resin on the first lead side of the semiconductor element is 0.37 (mm); and a relationship between a width W (mm) of the first lead in the region and a thickness t (mm) of the first lead in the region is expressed by $W \leq -1.95t+0.44$.

22. A semiconductor device according to claim 21, wherein the column of electrodes extends in said first direction such that said region of said first lead and said column of electrodes are substantially parallel to one another.

23. A semiconductor device according to claim 21, wherein the first lead is a common power supply lead.

* * * * *